United States Patent
Tavakoli et al.

(10) Patent No.: US 12,336,115 B2
(45) Date of Patent: Jun. 17, 2025

(54) LIQUID METAL FUSION WITH CONDUCTIVE INKS AND PASTES

(71) Applicants: CARNEGIE MELLON UNIVERSITY, Pittsburgh, PA (US); UNIVERSIDADE DE COIMBRA, Coimbra (PT)

(72) Inventors: Mahmoud Tavakoli, Coimbra (PT); Hugo Paisana, Coimbra (PT); Anibal T. De Almeida, Coimbra (PT); Carmel Majidi, Pittsburgh, PA (US)

(73) Assignees: UNIVERSIDADE DE COIMBRA, Coimbra (PT); CARNEGIE MELLON UNIVERSITY, Pittsburgh, PA (US)

( * ) Notice: Subject to any disclaimer, the term of this patent is extended or adjusted under 35 U.S.C. 154(b) by 0 days.

(21) Appl. No.: 17/857,356

(22) Filed: Jul. 5, 2022

(65) Prior Publication Data
US 2022/0346238 A1  Oct. 27, 2022

Related U.S. Application Data

(62) Division of application No. 16/647,083, filed as application No. PCT/US2018/050920 on Sep. 13, 2018, now Pat. No. 11,395,413.

(60) Provisional application No. 62/606,187, filed on Sep. 13, 2017, provisional application No. 62/762,975, filed on May 25, 2018.

(30) Foreign Application Priority Data

Sep. 7, 2018  (PT) .......................... 20181000058782

(51) Int. Cl.
| | |
|---|---|
| H01K 3/24 | (2006.01) |
| B41M 3/00 | (2006.01) |
| C09D 11/037 | (2014.01) |
| C09D 11/322 | (2014.01) |
| C09D 11/52 | (2014.01) |
| H05K 1/03 | (2006.01) |
| H05K 1/09 | (2006.01) |
| H05K 3/02 | (2006.01) |
| H05K 3/24 | (2006.01) |

(52) U.S. Cl.
CPC ............. *H05K 3/246* (2013.01); *B41M 3/006* (2013.01); *C09D 11/037* (2013.01); *C09D 11/322* (2013.01); *C09D 11/52* (2013.01); *H05K 1/0386* (2013.01); *H05K 1/097* (2013.01); *H05K 3/027* (2013.01); *H05K 2203/107* (2013.01); *H05K 2203/128* (2013.01)

(58) Field of Classification Search
CPC ...................................................... H05K 3/246
See application file for complete search history.

(56) References Cited

U.S. PATENT DOCUMENTS

| | | |
|---|---|---|
| 2013/0202909 A1 | 8/2013 | Byun |
| 2015/0129276 A1 | 5/2015 | Schumaker et al. |
| 2015/0129808 A1* | 5/2015 | Mrozek ..................... H01B 3/46 252/503 |
| 2016/0049227 A1 | 2/2016 | Bottiglio |
| 2016/0366760 A1 | 12/2016 | Lee |
| 2017/0164461 A1 | 6/2017 | Lathrop |
| 2020/0229304 A1 | 7/2020 | Hersam |
| 2020/0365293 A1* | 11/2020 | Ronay ..................... H01B 1/02 |
| 2021/0115283 A1 | 4/2021 | Wang |

FOREIGN PATENT DOCUMENTS

| | | |
|---|---|---|
| WO | 2017072347 A1 | 5/2017 |
| WO | 2017151523 A1 | 9/2017 |

OTHER PUBLICATIONS

Kramer et al., "Masked Deposition of Gallium-Indium Alloys for Liquid-Embedded Elastomer Conductors", Advanced Functional Materials, Nov. 2013, pp. 5292-5296, vol. 23, No. 42.

Tavakoli, Mahmoud et al., "EGaIn-Assisted Room-Temperature Sintering of Silver Nanoparticles for Stretchable, Inkjet-Printed, Thin-Film Electronics," Advanced Materials, Jul. 2018, pp. 1-7, vol. 30.

* cited by examiner

*Primary Examiner* — Austin Murata
(74) *Attorney, Agent, or Firm* — Leason Ellis LLP

(57) ABSTRACT

Coating inkjet-printed traces of silver nanoparticles (AgNP) ink with a thin layer of eutectic gallium indium (EGaIn) increases the electrical conductivity and significantly improves tolerance to tensile strain. This enhancement is achieved through a room temperature "sintering" process in which the liquid-phase EGaIn alloy binds the AgNP particles to form a continuous conductive trace. These mechanically robust thin-film circuits are well suited for transfer to highly curved and non-developable 3D surfaces as well as skin and other soft deformable substrates.

13 Claims, 11 Drawing Sheets

LIQUID METAL FUSION WITH CONDUCTIVE INKS AND PASTES

RELATED APPLICATIONS

This application is a Divisional Application of U.S. application ser. No. 16/647,083, filed on Mar. 13, 2020, which is a U.S. National Stage Application under 35 U.S.C. § 371 of International Patent Application No. PCT/US2018/050920, filed Sep. 13, 2018 which claims the benefit of U.S. Provisional Application No. 62/606,187, filed Sep. 13, 2017, U.S. Provisional Application No. 62/762,975, filed May 25, 2018 and Portugal Provisional Application No. 20/181,000058782, filed Sep. 7, 2018.

BACKGROUND

Ultrathin electronics that are mechanically compliant and deformable are important components in many potentially transformative technologies, for example, wearable computing, epidermal biomonitoring, soft robotics, flexible displays, and 3D-transferable printed electronics. These thin-film circuits must be adequately soft, bendable, and stretchable so that they can conform to a broad range of substrates (e.g. flat or 3D, developable or non-developable, rigid or soft) without significantly altering their natural mechanical properties.

Some applications in soft robotics and shape reconfigurable systems require "hyperelastic" soft electronics that can be stretched to several times their length with negligible mechanical or electrical hysteresis and only limited electromechanical coupling. However, for most emerging applications, "artificial skin" electronics do not have to be hyperelastic and should instead exhibit mechanical properties similar to lightweight fabrics or temporary tattoo film. That is, they should remain functional under bending, folding, twisting, and strains of up to ~30%, which is the typical stretchability of natural human skin. This compliance allows for compatibility with a broad range of host substrates, from human skin and soft elastomers to rigid 3D printed surfaces with sharp edges and non-developable features. Such features are particularly enabling for wearable computing and epidermal electronics, but also allow for the integration of printed circuits into the surface of flexible devices and complex 3D shapes.

Among the various paradigms for skin-like electronics that have been explored over the past few decades, electronic tattoos have become especially popular due to their high compliance, low thickness (approximately 5-10 μm), strong adhesion with natural skin, and mechanically robust functionality. Several efforts have focused on ultrathin plastic electronics and deterministic circuit architectures in which stretchable functionality is achieved with circuit traces that have a wavy, horseshoe or serpentine geometry.

More recently, there has been growing interest in thin film circuits that can be produced with inkjet printing, screen printing, or other patterning techniques that are rapid and inexpensive. This includes efforts with Au foils, carbon inks and greases, conductive polymers and Ag-based inks and elastomer composites. Low viscosity inks containing silver nanoparticles (AgNP) or elemental silver are especially popular due to their compatibility with inkjet printing and superior electrical conductivity. Sinter-free Ag inks are of particular interest because they do not require heating, plasma treatment, or other post-processing steps that could damage the circuit substrate or surface-mounted microelectronics.

AgNP ink that is specialized for inkjet printing is commercially-available. While promising for room temperature circuit printing, this ink requires a specialized, solvent-compatible, microporous substrate with a chemical reacting agent to eliminate crack formation and to create percolating networks of AgNP. If printed on other carrier mediums, the circuit will exhibit poor conductivity and fail under light mechanical loading. Such a constraint greatly limits the ability to print circuits on a wider variety of soft and stretchable substrates that are mechanically robust, compatible with human skin, or transferrable to 3D objects with arbitrary shapes and surface textures. Other printing fabrication methods of conductive metal electrodes such as polymer and co-polymer assisted metal deposition techniques have been developed to eliminate the need for precursor dispersion and high temperature sintering of printed thin film electronics. However, prior to printing, extensive preparation and modifications to the conductive ink or nano-particle precursors are typically required.

SUMMARY OF THE INVENTION

Described herein is a material composition and a process that enhances conductivity and stretchability of the conductive inks and pastes.

In one embodiment, the composition described herein includes the addition of a gallium or indium element, or a gallium-indium alloy, with silver-based or copper-based conductive inks or pastes made with nano-particles, micro-particles, or flakes. Gallium, indium or their alloys can be mixed directly with the particles and the carrier medium, typically a liquid or polymer, for making a conductive and stretchable ink or paste.

In another embodiment, after deposition or printing of the silver-based or copper-based ink or paste over a substrate, a eutectic gallium-indium alloy can be applied over the deposited or printed circuit. In both cases, the liquid metal contributes to agglomeration of particles and fills the cracks and spaces created between the particles, rendering the printed circuit conductive.

The composition can be the addition of any amount of gallium and or indium separately or in conjunction with any silver-based or copper-based ink, prior to or after deposition.

BRIEF DESCRIPTION OF THE DRAWINGS

FIG. 3 is a graph showing the difference in electrical conductivity and maximum strain between AgNP and AgNP-Ga-In.

DETAILED DESCRIPTION

Figure 1A:
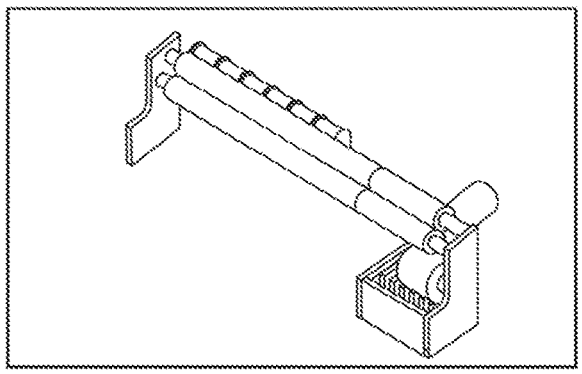
FIGS. 1A through 1H depict stages of a process for producing conductive traces in accordance with one embodiment of the present invention.
Figure 1E:
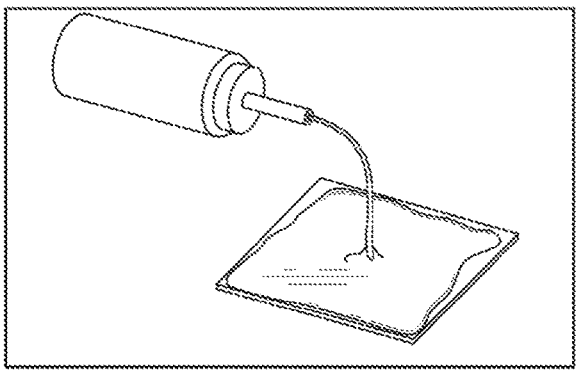
Figure 1B:
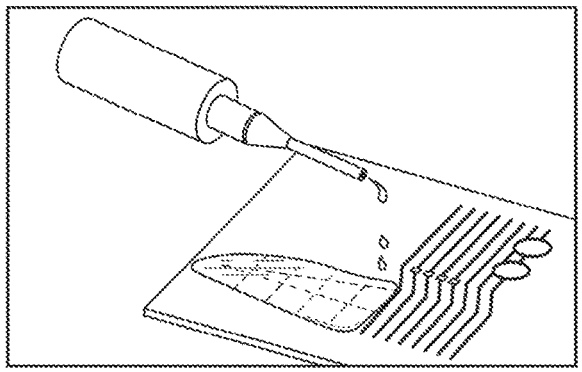
Figure 1F:
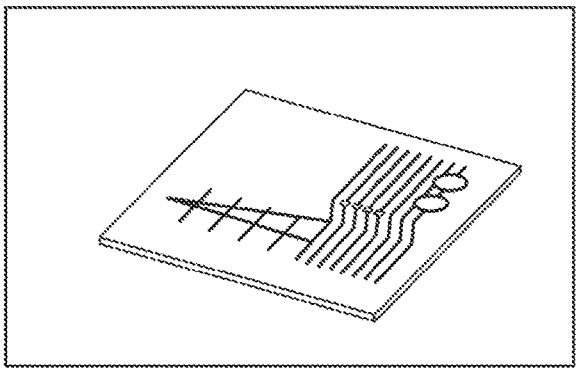
Figure 1C:
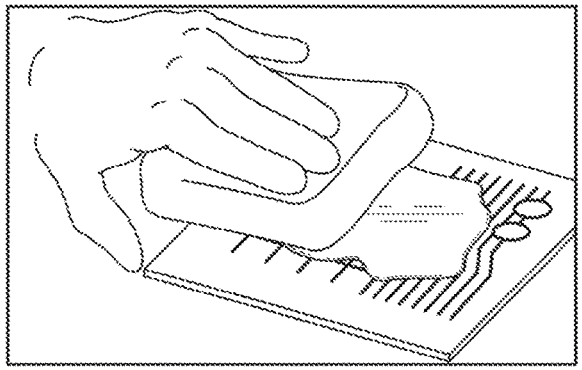
Figure 1G:
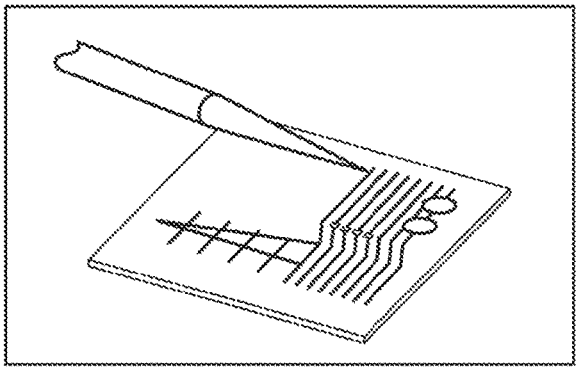
Figure 1D:
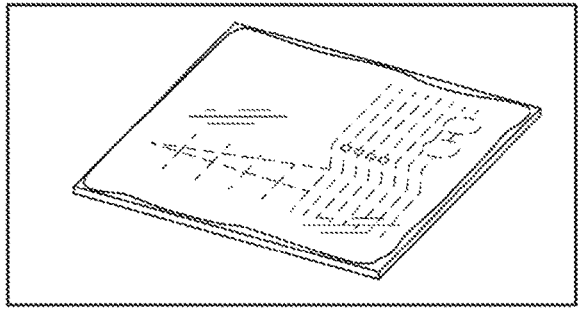
Figure 1H:
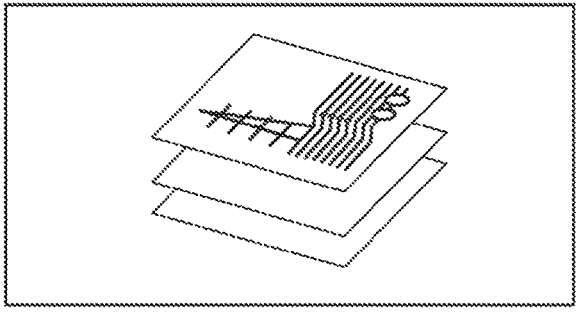

As used herein, the term "liquid metal" means any metal or metal alloy that is in a liquid phase at temperatures below 30° C. Examples include Gallium, Gallium-Indium alloy, and Gallium-Indium-Tin alloy.

Conductive inks and pastes are usually made with an agent or carrier medium carrying micro- or nano-particles. Most such inks are not conductive or poorly conductive immediately after deposition. They require a sintering process, which can be based on applied heat or light, to make the traces conductive. After the sintering process, these inks become conductive, but not stretchable. A small amount of strain applied to the printed circuits causes cracking of the traces, rendering them nonconductive.

In one embodiment of the invention, the application of liquid metal over the printed traces enhances the conductivity by orders of magnitude, thereby eliminating the need for thermal or light-based sintering. This process aids in better agglomeration and self-assembly of nano-particles, thereby creating conductive paths. As an example, a printed trace with a resistance of over 50 MΩ had its resistance reduced to less than 30 Ω after application of this process. In addition, the resulting traces can withstand large amounts of strain without losing conductivity.

In an alternate embodiment, a printable substance providing similar results can be created by pre-mixing (prior to printing) a eutectic gallium/indium alloy with silver or copper particles. That is, the ink does not require a sintering process. As such, its application is not limited to heat resistant substrates. Additionally, the deposited ink can be stretched up to 100% of its initial length without losing conductivity. The printable substance for producing electrically conductive patterns may comprise metal particles suspended in a carrier medium and liquid metal mixed into the carrier medium, wherein the mixture is at least 0.1% weight percent of liquid metal. In various embodiments, the metal particles may include, but are not limited to, spheres, beads, flakes, wires, or tubes with dimensions ranging from 1 nm to 1 mm of a metal selected from a group comprising silver particles or silver-coated particles, copper particles or copper-coated particles, gold particles or gold coated particles or nickel particles or nickel coated particles. The liquid metal is a preferably a eutectic alloy of gallium and indium. In various embodiments, the carrier medium may be a liquid or polymer which can be diluted to adjust the viscosity of the printable substance. The liquid metal may be mixed into the carrier medium and the metal particles by any known method, including, but not limited to shear force mixing, including centrifugal, planetary, and manual mixing and ultrasonic mixing.

In one embodiment, circuits can be printing on tattoo paper, transfer paper or hydrographic paper using the method disclosed herein and can thereafter be transferred to almost any 3D surface. This includes transferring the circuit to the human body for bio-monitoring, or to any object such as a plastic part, a wall, a table, a printed circuit with soldered electronics, or a 3D printed part. This then allows fabrication of the part, regardless of the electronics, followed by transfer of the electronic circuits over them. In other embodiments, the circuits may also be printed onto a polymer substrate to allow for bendability. In yet other embodiments, the circuits could be printed directly on a non-polymeric substrate, including, but not limited to paper, textile, ceramic, wood or foam.

This process is particularly interesting for applications involving in-mold electronics, that is, transferring electronics over plastic parts with vacuum molding or similar process that only works with a stretchable ink. There are also applications in textile electronics and sending, biomonitoring patches and thin-film tattoo like patches, and in several other domains, such as thin film batteries, solar panels, printed transistors, OLEDs, transparent conducting films, ultrathin pressure films, human machine interaction, interactive art, printed displays, interactive packaging, etc.

In one embodiment, the liquid metal treatment drastically improves the conductivity and mechanical deformability of Ag-based conductive ink circuits printed on temporary tattoo paper, as shown in FIG. 1. The circuit is produced by printing AgNP ink on tattoo film and then coating the printed ink with eutectic gallium-indium (EGaIn). EGaIn is a non-toxic metal alloy that is liquid at room temperature and mixes with silver to form thin, highly conductive and mechanically robust semi-solid circuit traces.

In contrast to conventional sintering, the silver nanoparticles interact with the liquid alloy to form a heterogeneous substance composed of AgNP—In—Ga clusters surrounded by a Ga-rich film. These traces maintain high electrical conductivity and low electromechanical coupling (gauge factor ~1) for axial strains up to 80% and can withstand strains above 100% prior to complete electrical or mechanical failure. Because the fabrication process is performed in ambient conditions and in an inert chemical environment, circuits can be printed on a wide range of substrates, including, for example, polymeric thin films. This technique greatly simplifies the manufacturing process by eliminating the need for microfabrication, thin-film metal deposition, and lithographic patterning. Instead, Ag traces are printed with a desktop inkjet printer and then coated with a thin layer of EGaIn using a simple deposition and cleaning technique.

As illustrated in FIG. 1A, circuits are produced with the following processing steps: First, a circuit consisting of one or more electric traces comprising a conductive ink, for example, AgNP ink, is deposited on a polymeric film (i). The deposition of the electric traces could be accomplished in any way, for example, by inkjet printing, screen printing, roll-to-roll printing, aerosol deposition, contact printing or uniform thin film deposition by spin coating, or by any other method known or yet to be developed. For the initial printing of the circuit, a conductive ink or paste may be used. Such ink may comprise, in some embodiments, silver, copper or gold in the form of nano- or micro-particles, flakes, wires, or tubes with dimensions ranging from 1 nm to 1 mm, silver, copper or gold-coated particles or silver, copper or gold salts. In a preferred embodiment, a conductive ink comprising nano-particles of silver (AgNP) is used. Although AgNP is used in explanations of the invention herein, it should be realized that the invention is not limited to the used of AgNP-based conductive inks.

Next, drops of the liquid eutectic gallium/indium alloy (EGaIn) are deposited (ii) and rubbed onto the circuit using a lint-free cloth (iii) to cover the entire circuit (iv). In alternate embodiment, other liquid metals or methods of applying the liquid metal may be used, including, but not limited to manual surface coating, spin coating, spray deposition, dip coating, roll-to-roll coating, knife coating and gravure coating. Preferably the liquid metal will be liquid at a temperature below 50° C. Note that the invention is explain using EGaIn as an example liquid medium, but that any suitable liquid metal allows having the required properties may be used.

Thereafter, the excess EGaIn is removed by applying a weak aqueous or basis solution or vapor such as acetic acid or hydrochloric acid vapor(v) which dewets the liquid metal from the rest of the circuit, except where circuits were previously printed. Once fully cleaned (vi), the circuit can be populated with surface mount chips (vii). The final circuit is ready to be released from its carrier film (viii) and transferred to 3D surfaces, such as human skin.

In various embodiments, the liquid metal may be washed from the substrate using any known method, including, but not limited to manual wiping, gas or fluid pressure, ultrasonic cleaning, acid vapor, acid or basis liquid cleaning and application of electrical voltage.

In some embodiments, the liquid metal may be deposited selectively over the printed traces of the circuit, and not on the substrate, thereby eliminating the need for the washing step. The selective deposition method may be any known method of selectively depositing a substance, including, but not limited to, screen printing, electroplating, inkjet printing and contact printing.

In an alternative embodiment, a full layer of the metal ink is first printed all over the substrate, followed by a full layer deposition of liquid metal, followed by laser ablation for patterning of the circuit.

Figures 2A, 2B:
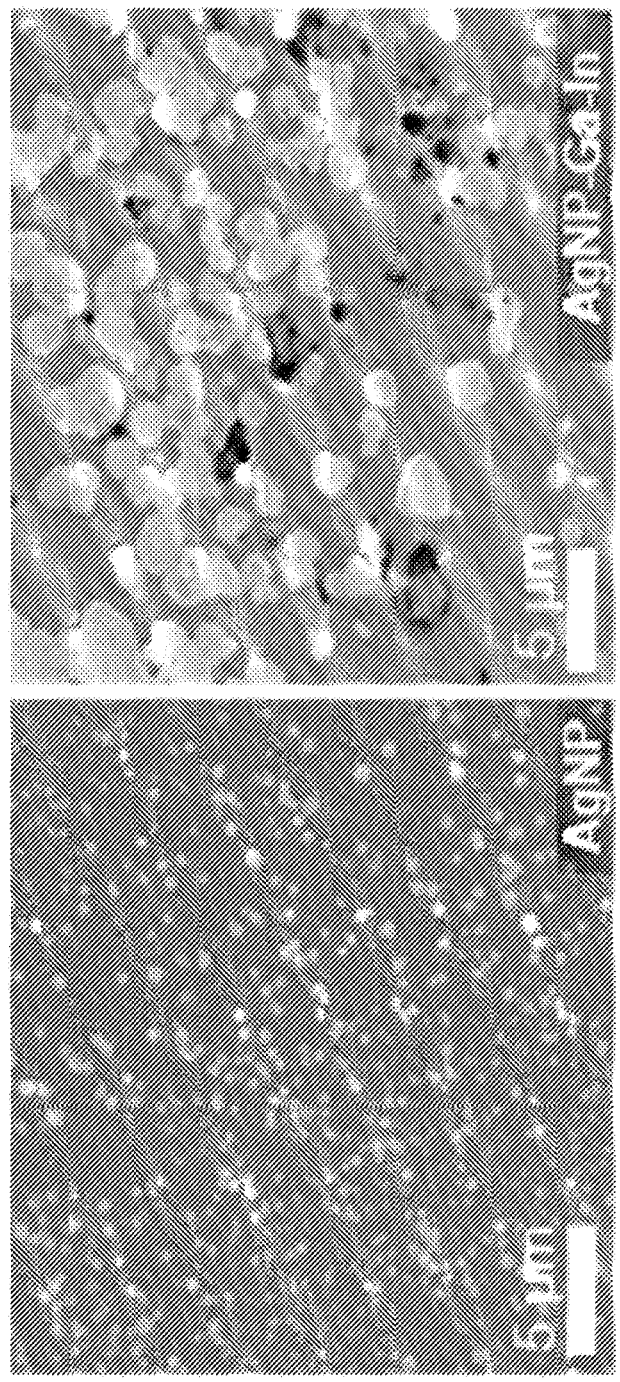
FIG. 2A and 2B are micrographs of printed AgNP ink prior to and subsequent to the deposition of EGain, respectively.
Figure 3:
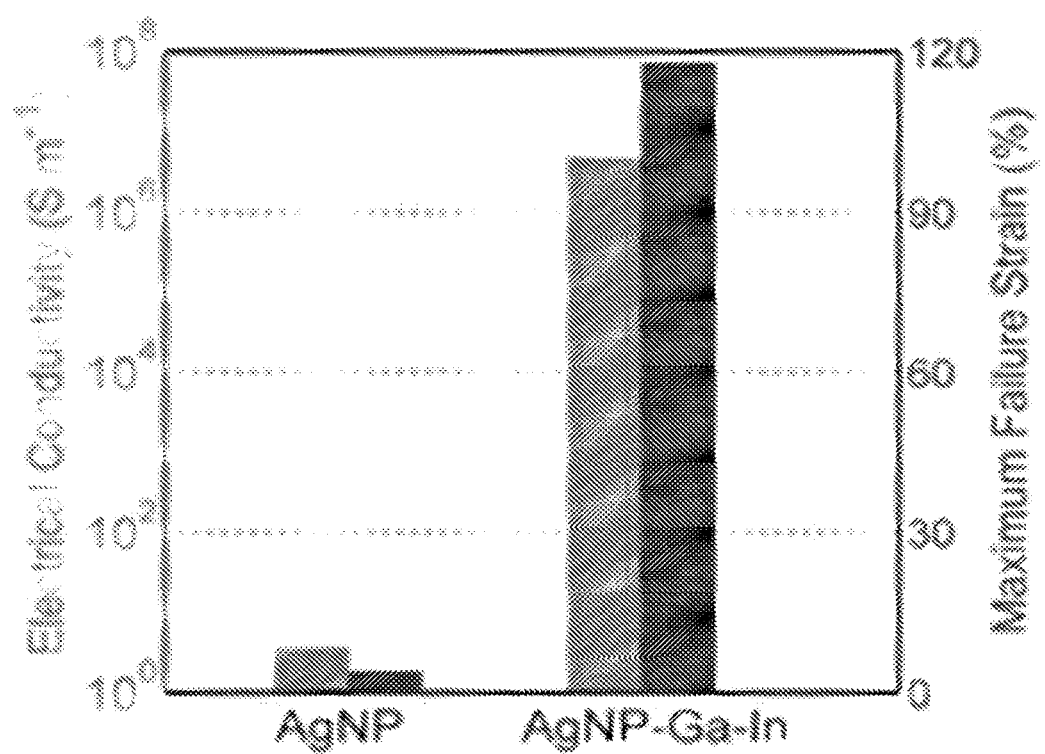

Prior to EGaIn deposition, the AgNP ink is non-conductive due to the low density of AgNP and lack of percolation, as shown in FIG. 2A. When EGaIn is added, it causes the nano-particles to aggregate and fills in the gaps to form a continuous metallic film, as shown in FIG. 2B. The existence of a liquid phase alloy within the printed Ag—Ga—In circuit contributes to the stretchability of the circuits. EGaIn deposition has been observed to result in a 6 order-of-magnitude increase in volumetric conductivity from 3.6 to $4.85 \times 10^6$ S.m$^{-1}$ for printed circuits and more than a 25×increase in the maximum failure strain of the thin-film circuits from 4.5% to 118% strain, as shown in FIG. 3. Moreover, such circuits are highly flexible and can support enough strain to be transferred to curved, highly textured, non-developable 3D surfaces like the model brain shown in FIG. 11.

Figure 4A:
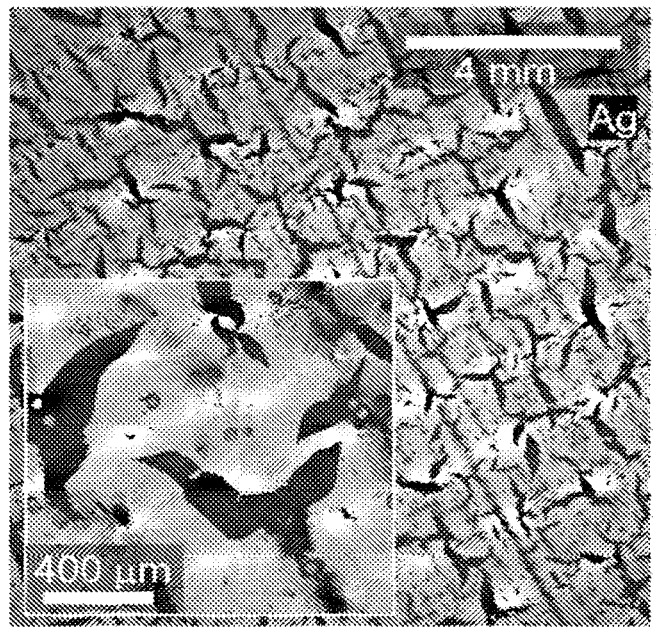
FIG. 4A and 4B show micrographs of the conductive ink before and after EGain treatment, respectively.
Figure 4B:
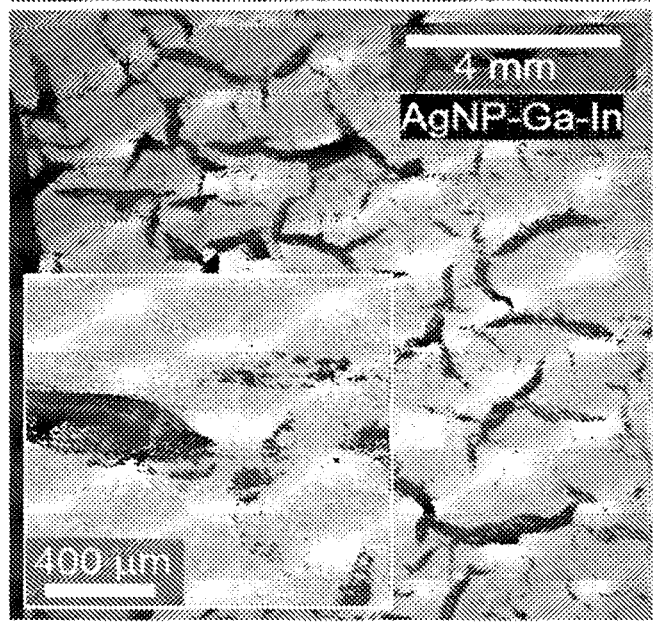

Scanning electronic microscopy (SEM) and energy dispersive X-ray spectroscopy (EDS) are used to examine the features and composition of the AgNP—Ga—In mixture. Micrographs of the conductive ink before and after EGaIn treatment are shown in FIGS. 4A and 4B, respectively. At lower magnification, a large number of small cracks within the conductive trace are clearly visible. These cracks are formed on the tattoo film because of solvent evaporation and consequent contraction of silver ink after printing. However, most of the small cracks are completely filled with the liquid metal after the treatment as shown in FIG. 4B.

Figures 5A, 5B:
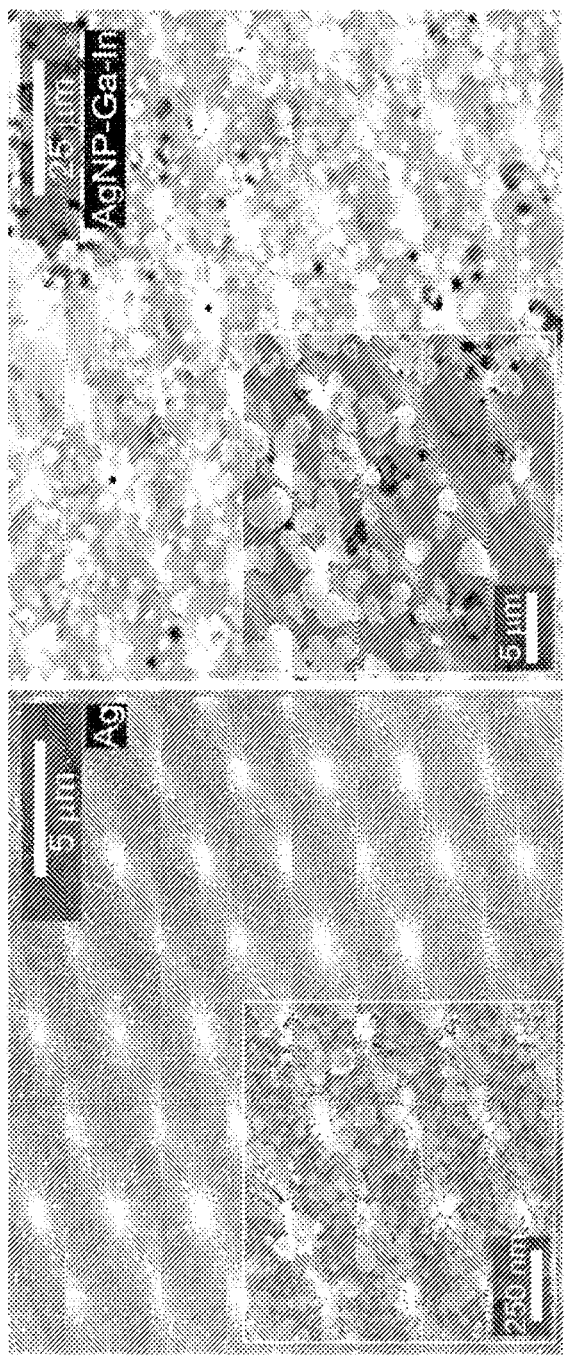
FIG. 5A and 5B are higher magnification versions of the micro graphs shown in FIGS. 4A and 4B, showing how the liquid metal causes the AgNP to cluster into aggregates.
Figure 6:
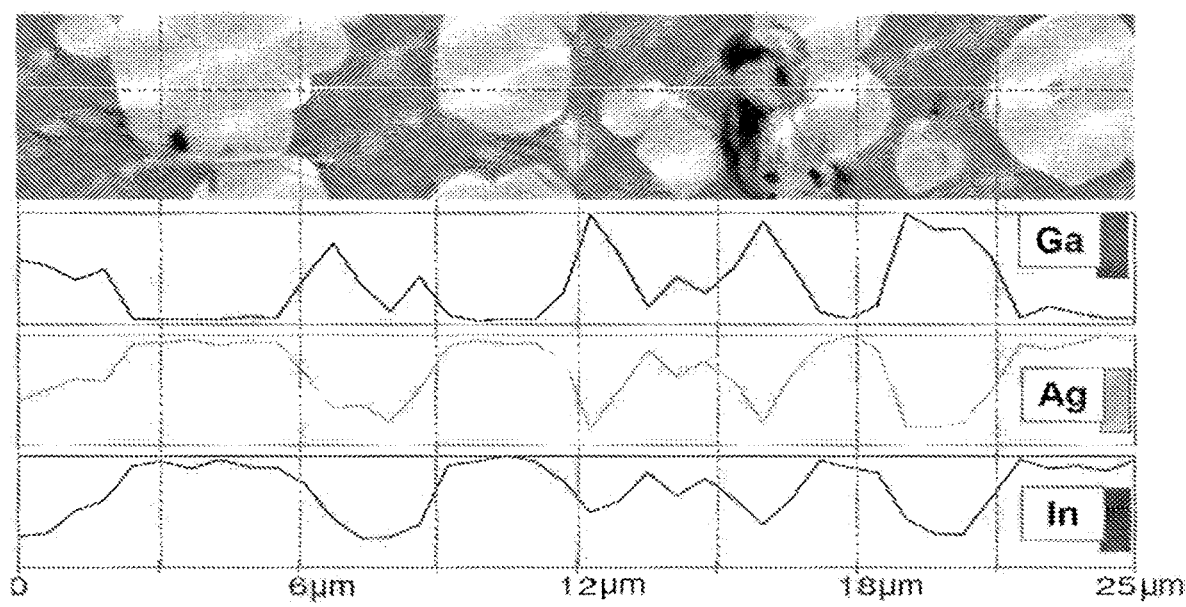
FIG. 6 shows an EDS analysis performed over a 25 μm-long scanning line showing the Ag, Ga and In concentration profiles.

As observed at higher magnification micrographs, in FIG. 5A and 5B, the liquid metal also causes the AgNP to cluster into aggregates that are at least 5×larger than the individual particles. These aggregates form connected agglomerates with increased surface roughness which may contribute to the improved global conductivity. Referring to FIG. 6, EDS analysis performed over a 25 μm-long scanning line shows that Ag and In concentration profiles are similar to each other but opposite with respect to the Ga profile. In particular, higher amounts of Ag and In and low amounts of Ga are found on the white areas, which correspond to the location of AgNP—Ga—In clusters. In contrast, higher concentrations of Ga are detected in the grey areas outside the clusters. Note that both the white and grey areas in the images are located within the printed AgNP—Ga—In trace. EDS analysis confirms that within the Ga-rich regions, the Ga:In ratio is ~3:1 (i.e. similar to that of the original EGaIn alloy) while on the AgNP—Ga—In clusters it is approximately 1:2.

Figure 7:
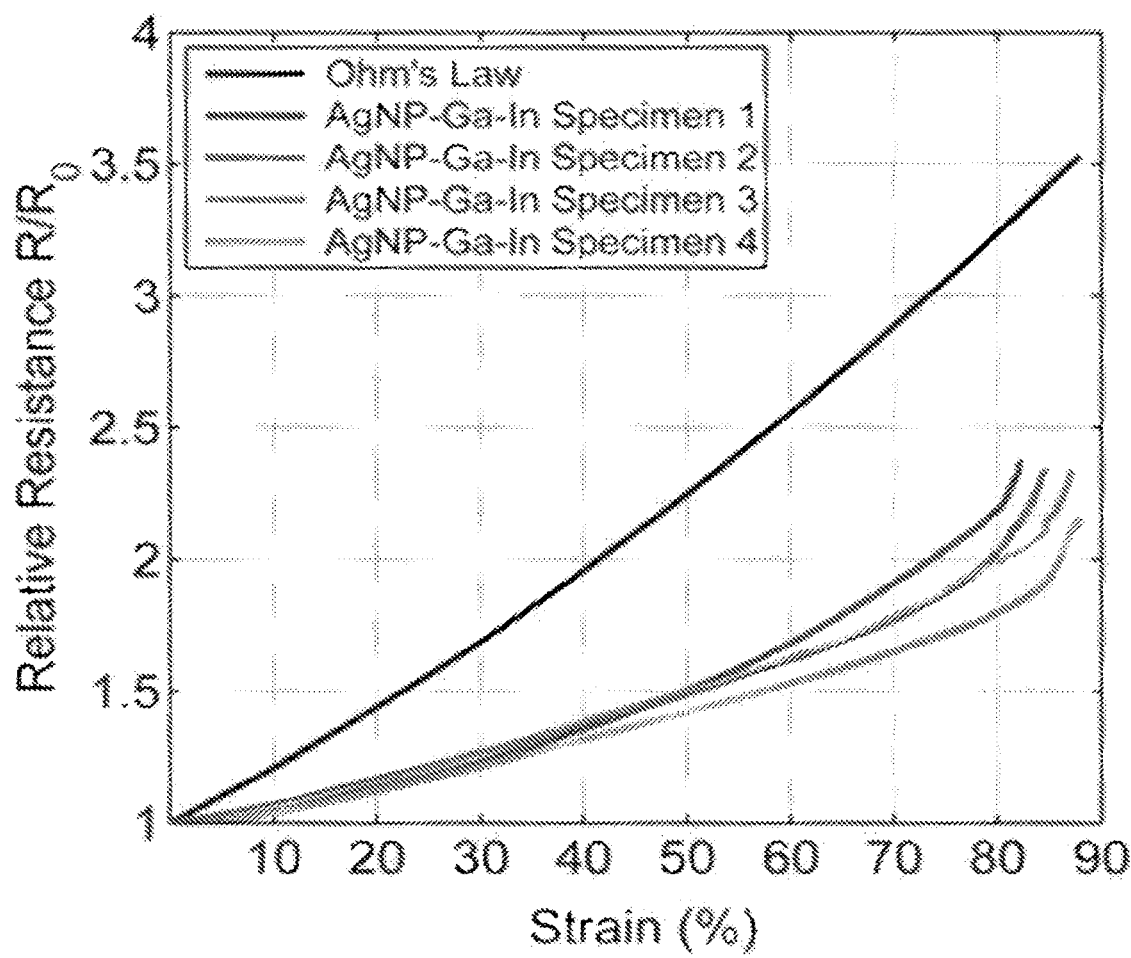
FIG. 7 is a graph showing strain versus electrical resistance for conductive traces on a polymer substrate

The functionality of conductive AgNP—Ga—In traces under large mechanical deformations can be also demonstrated by placing the conductive traces printed on a thin film polymer substrate between two layers of polydimethylsiloxane (PDMS), a widely used silicon-based organic polymer, and cutting them into a standard "dogbone" shape. The specimen is then subjected to uniaxial tensile loading to replicate the mechanical loading conditions for electronic tattoo transfer on human skin. As shown in FIG. 7, the samples maintain their high electrical conductivity under applied strains up to and above 80% and demonstrate a repeatable and reliable electromechanical response. However, in some cases, failure strains of the specimens have been measured to be as high as 118% for the same loading condition and fabrication process. Changing the speed of tensile testing or using different width of conductive traces has only minor effects on the electromechanical response of conductive AgNP—Ga—In traces. The ability for the specimens to remain electrically conductive and maintain moderate electromechanical coupling during continuous mechanical cycling suggests that these electronic tattoos could have adequate durability for daily use on the human body.

Figure 8:
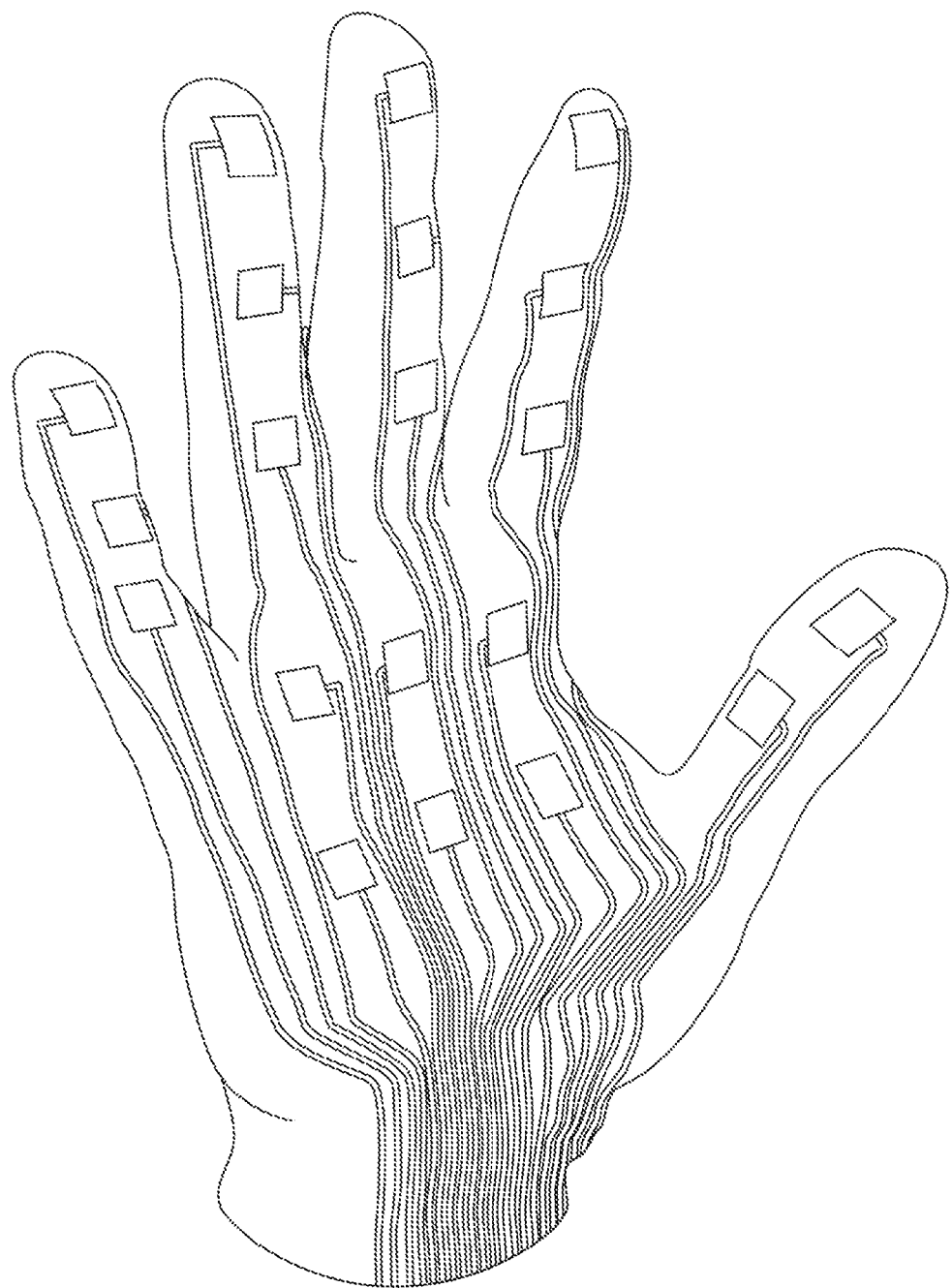
FIG. 8 shows a 3D printed model of a hand having a circuit placed thereon using hydrographic transfer.
Figure 9:
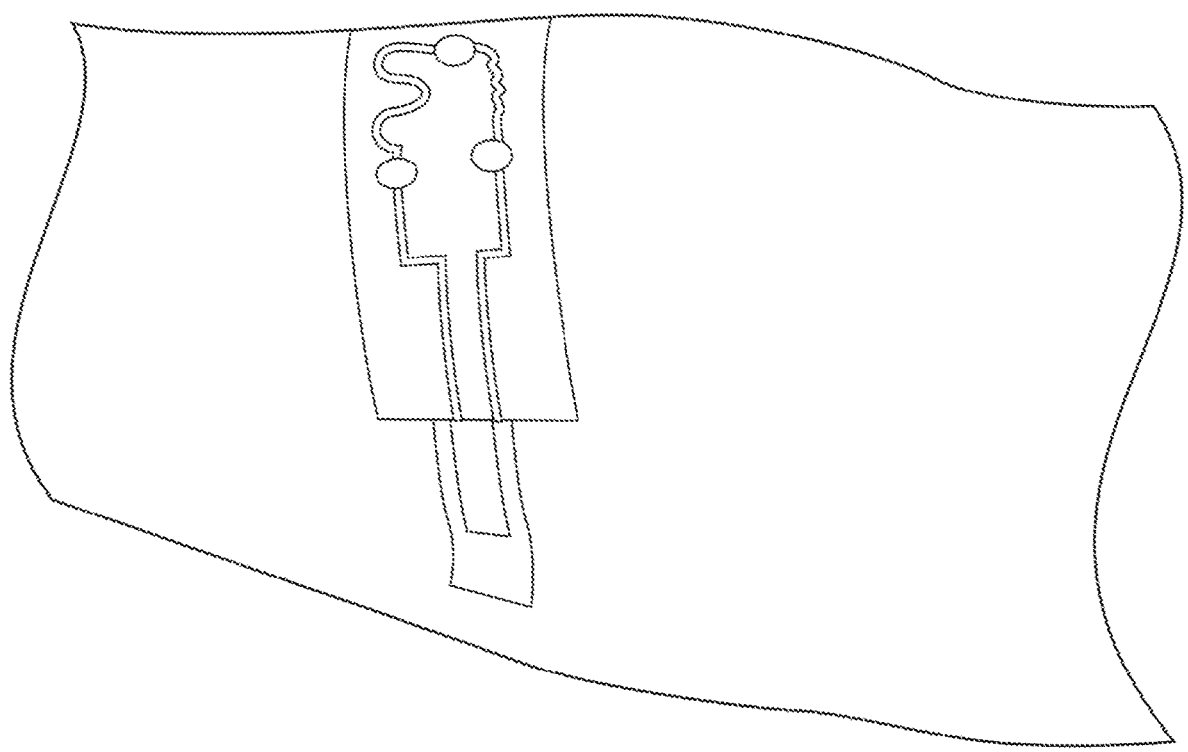
FIG. 9 shows a circuit functioning as an electronic tattoo, disposed on a human arm.
Figure 10:
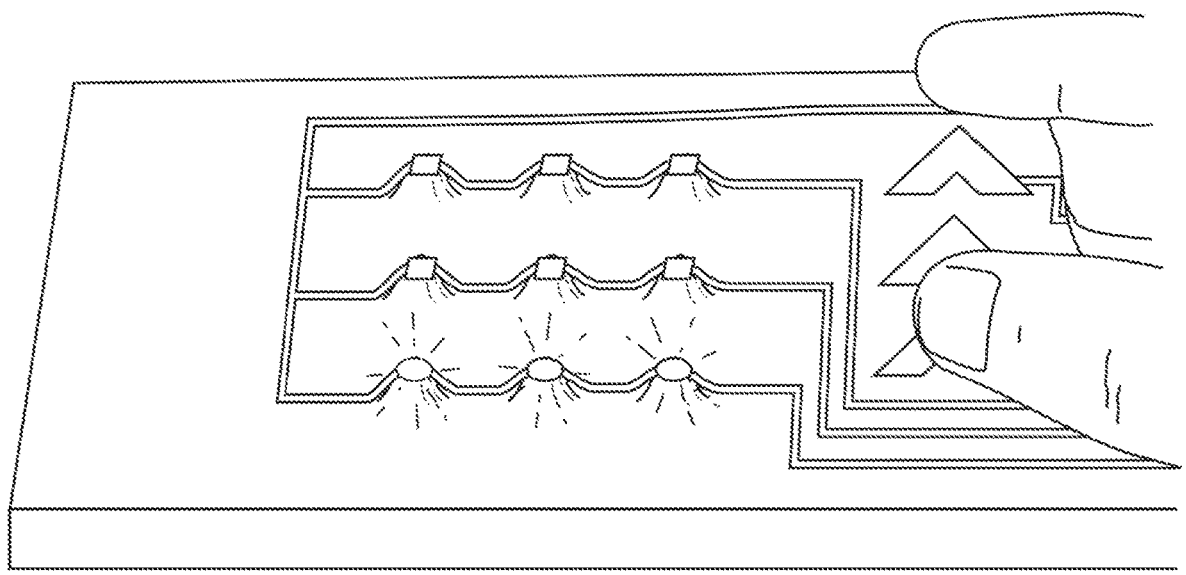
FIG. 10 shows a circuit transferred to a 3D printed object.
Figures 11A, 11B:
FIG. 11A and 11B show conductive traces that are transferred to a model of a brain maintain conductivity when deformed..

Using hydrographic transfer, the circuit can be placed on 3D objects. A 3D printed model of a hand having a circuit disposed thereon is shown in FIG. 8. The circuit can also function as an electronic tattoo with on-board microelectronic chips for visual display and power regulation, as shown in FIG. 9, with placement on a human arm. FIG. 10 shows placement of a circuit over a 3D printed object. Moreover, the stretchability of the ultra-thin conductive traces is also demonstrated on the highly textured brain-shaped foam with mounted LEDs, as shown in FIG. 11A. Squeezing the foam deforms the circuit but does not interfere with the operation of the LEDs, which remain functional, as shown in FIG. 11B. These circuits are only a few examples to demonstrate mechanical robustness and functionality of stretchable AgNP—Ga—In conductors.

Disclosed herein is a technique to rapidly create soft and stretchable thin film electronics. The circuits are produced with ink-jet printed silver nano-particles (AgNP) that interact with a eutectic gallium-indium alloy (EGaIn) at room temperature to form mechanically robust conductive traces. With the EGaIn coating, the traces exhibit a$\times 10^6$ increase in electrical conductivity and maintain low trace resistance under bending or when stretched to 80% strain. On a soft elastomer substrate, such as PDMS, the trace exhibits a moderate electromechanical response (e.g. 50% increase in electrical resistance with 50% strain; gauge factor ≈1) that is consistent over hundreds of loading cycles.

When printed on temporary tattoo paper, the circuits can be placed on 3D surfaces using hydrographic transfer or worn on the skin as an electronic tattoo. Because the circuit is stretchable, it can be transferred to highly curved and non-developable (e.g. spherical) surfaces or placed over parts of the body that undergo significant strain. Moreover, unlike other approaches to stretchable electronics (e.g. conductive elastomers, wavy circuits, EGaIn microfluidics, etc.), thin-film circuits can be produced using a conventional inkjet printer. This novel methodology leads to highly customized and feasible fabrication techniques of soft on-skin electronics that have never been demonstrated before. Future efforts will focus on further elemental and topographic characterization of AgNP—Ga—In circuits printed on various substrates, optimization of AgNP printing, deposition, and cleaning techniques for achieving highest stretchability and conductivity, optimization of the transfer techniques, and demonstration of a series of thin film e-skin circuits over the body for bio-monitoring, and over 3D surfaces for interactive HMIs.

The scope of the invention is not meant to be limited by any examples provided herein to explain the invention, but instead is defined by the scope of the following claims.

We claim:

1. A conductive, printable ink for producing electrically conductive patterns, consisting of:
    metal particle suspension including a polymer carrier medium, wherein the suspension is diluted to thereby adjust a viscosity of the suspension; and
    liquid metal mixed into the polymer carrier medium at room temperature, wherein the liquid metal is an alloy of gallium and indium, and wherein the liquid metal is in liquid phase below 30° C.,
    wherein the ink is at least 0.1% weight percent of the liquid metal,
    wherein the metal particles consist of silver in the form of silver particles, or silver-covered particles, or both silver particles and silver-covered particles, and
    wherein the ink has a viscosity that is within a range that enables inkjet printing, screen printing, roll-to-roll printing, aerosol deposition, contact printing, or uniform thin film deposition by spin coating wherein the carrier medium is a polymer diluted to adjust the viscosity of the ink.

2. The conductive printable ink of claim 1, wherein the metal particles are percolated by the liquid metal to enable or increase electrical conductivity.

3. The conductive printable ink of claim 1, wherein the gallium and indium alloy comprises at least in part a liquid-phase gallium and indium alloy binding the metal particles.

4. The conductive printable ink of claim 1, wherein the gallium and indium alloy is an eutectic gallium-indium ("EGaIn") alloy.

5. The conductive printable ink of claim 4, obtained by mixing the eutectic gallium-indium ("EGaIn") alloy into the carrier medium, wherein the carrier medium is a polymer, causing clustering of the metal particles into intermetallic aggregates.

6. The conductive printable ink of claim 1, wherein the carrier medium is diluted to thereby enable the metal particles to cluster into connected aggregates to enable or increase conductivity.

7. The conductive printable ink of claim 1, wherein the carrier medium is diluted to thereby enable the metal particles to cluster into connected aggregates and to enable higher concentrations of Gallium outside the clusters.

8. The conductive printable ink of claim 1 wherein the carrier medium is a polymer diluted to adjust the viscosity of the printable ink to thereby enable percolation of the metal particles by the liquid metal to enable or increase electrical conductivity.

9. The conductive printable ink of claim 1, wherein the metal particles include spheres, beads, flakes, wires, or tubes.

10. The conductive printable ink of claim 1, wherein the carrier medium is a liquid or polymer which can be diluted to adjust the viscosity of the printable ink.

11. The conductive printable ink of claim 1, further comprising ultrasonically mixing the liquid metal into the polymer carrier medium.

12. The conductive printable ink of claim 1, further comprising shear force mixing of the liquid metal into the polymer carrier medium, wherein the shear force mixing includes at least one of centrifugal, planetary, and manual mixing.

13. The conductive printable ink of claim 1, wherein the metal particles have dimensions ranging from 1 nm to 1 mm.

* * * * *